United States Patent
Isshiki et al.

(10) Patent No.: US 11,137,282 B2
(45) Date of Patent: Oct. 5, 2021

(54) OPTICAL CONCENTRATION MEASUREMENT DEVICE COMPRISING A LIGHT RECEIVING UNIT WITH A RECTANGULAR LIGHT RECEIVING SURFACE

(71) Applicant: ASAHI KASEI MICRODEVICES CORPORATION, Tokyo (JP)

(72) Inventors: Shota Isshiki, Tokyo (JP); Takaaki Furuya, Tokyo (JP)

(73) Assignee: Asahi Kasei Microdevices Corporation, Tokyo (JP)

(*) Notice: Subject to any disclaimer, the term of this patent is extended or adjusted under 35 U.S.C. 154(b) by 0 days.

(21) Appl. No.: 17/034,193

(22) Filed: Sep. 28, 2020

(65) Prior Publication Data

US 2021/0096022 A1    Apr. 1, 2021

(30) Foreign Application Priority Data

Sep. 30, 2019 (JP) .............................. JP2019-180753
Sep. 16, 2020 (JP) .............................. JP2020-155820

(51) Int. Cl.
*G01J 1/04* (2006.01)
*G01N 21/3504* (2014.01)
(Continued)

(52) U.S. Cl.
CPC ............... *G01J 1/0422* (2013.01); *G01J 1/44* (2013.01); *G01N 21/3504* (2013.01); *H01L 31/173* (2013.01); *G01J 2001/446* (2013.01)

(58) Field of Classification Search
CPC ...... G01J 1/0422; G01J 1/44; G01N 21/3504; H01L 31/173
(Continued)

(56) References Cited

U.S. PATENT DOCUMENTS

| 3,354,320 A * | 11/1967 | Dryden .................... B64G 1/00 250/232 |
| 6,271,758 B1 | 8/2001 | Nakamura et al. |
| 2010/0129038 A1 | 5/2010 | Mukoyama et al. |

FOREIGN PATENT DOCUMENTS

| JP | H05-079979 A | 3/1993 |
| JP | H06-021485 A | 1/1994 |

(Continued)

OTHER PUBLICATIONS

Furuya, "Efficiency Improvement of Air Conditioning by Low Power Consumption CO2 Gas Sensor Using Room Temperature Operation Quantum Mid-Infrared Sensor and LED", The 7th JACI/GSC Symposium, Jun. 2018 (with Concise Explanation).

*Primary Examiner* — Que Tan Le
(74) *Attorney, Agent, or Firm* — Morgan, Lewis & Bockius LLP

(57) ABSTRACT

An optical concentration measurement device includes an LED light source, a light receiving unit having a rectangular light receiving surface and outputting a detection signal representing intensity of received light, and light guiding units guiding light emitted by the LED light source to the light receiving unit, wherein a shape on the rectangular light receiving surface of light radiated on the light receiving surface is rectangular, the optical concentration measurement device measures concentration of an object to be measured existing in a light path formed by the light guiding units, based on the detection signal output from the light receiving unit, and the light guiding units guide light at a diffraction limit or greater in such a way that area of the light on the rectangular light receiving surface is ½ or less of area of the rectangular light receiving surface.

14 Claims, 10 Drawing Sheets

(51) Int. Cl.
*G01J 1/44* (2006.01)
*H01L 31/173* (2006.01)

(58) Field of Classification Search
USPC .............................. 250/216, 239, 214.1, 221
See application file for complete search history.

(56) References Cited

FOREIGN PATENT DOCUMENTS

| JP | H07-092021 A | 4/1995 |
|----|--------------|--------|
| JP | H10-334362 A | 12/1998 |
| JP | 2010-122614 A | 6/2010 |
| JP | 2017-015567 A | 1/2017 |

\* cited by examiner

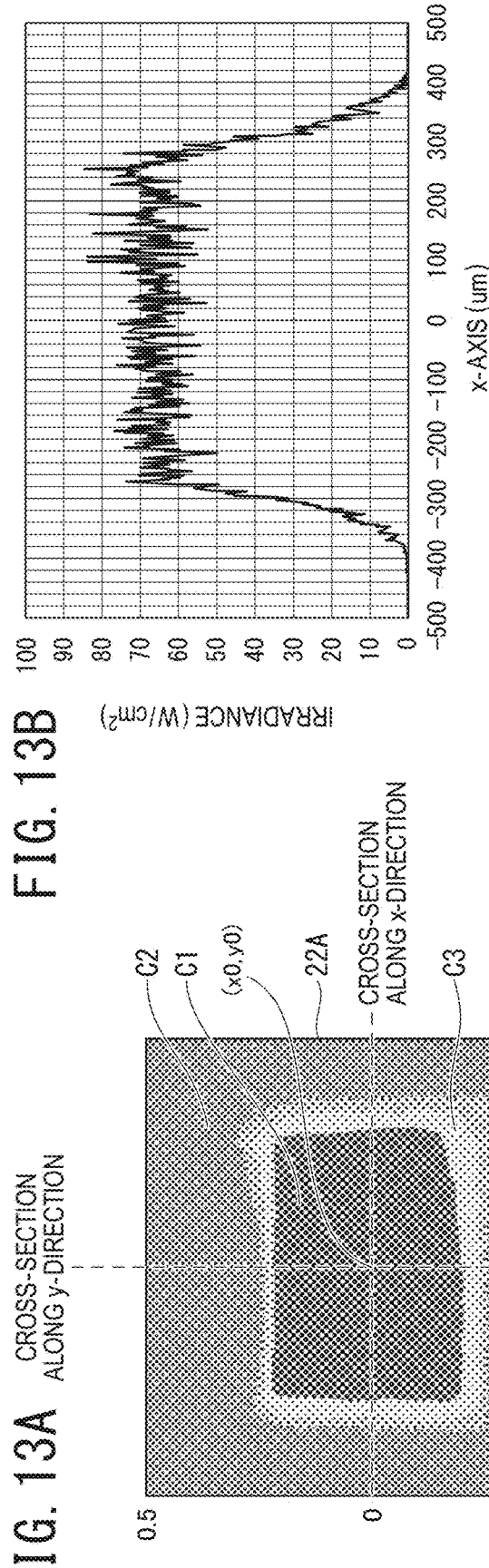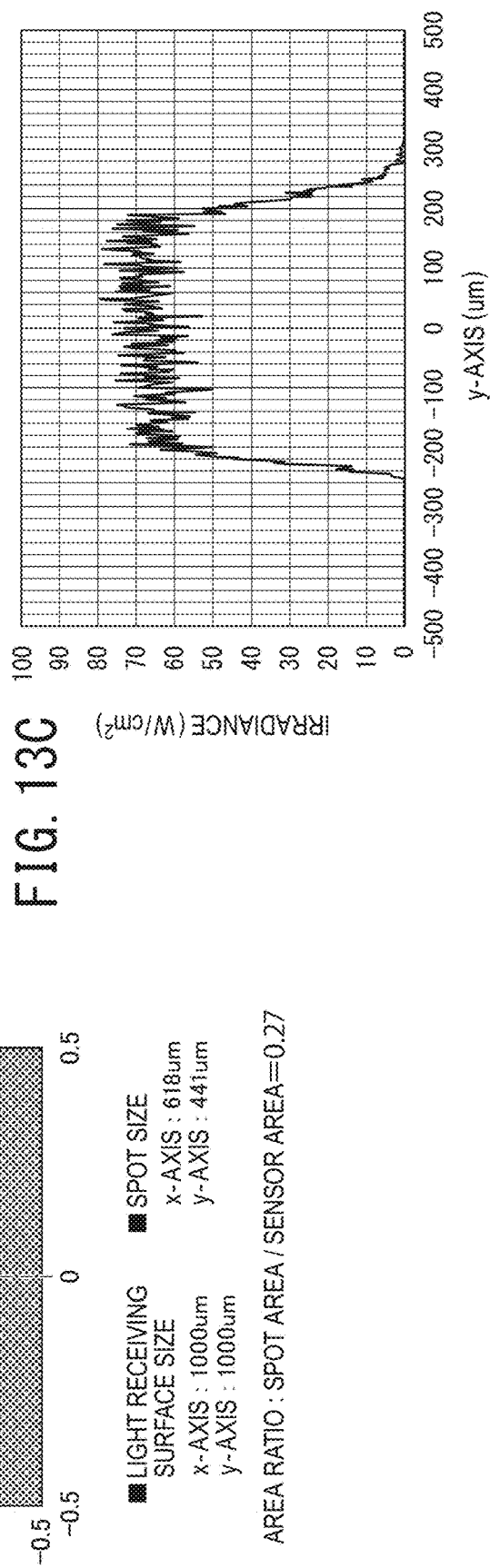

OPTICAL CONCENTRATION MEASUREMENT DEVICE COMPRISING A LIGHT RECEIVING UNIT WITH A RECTANGULAR LIGHT RECEIVING SURFACE

CROSS REFERENCE TO RELATED APPLICATIONS AND INCORPORATION BY REFERENCE

This application claims benefit of priority under 35 U.S.C. 119 based on Japanese Patent Applications No. 2019-180753 filed on Sep. 30, 2019, and No. 2020-155820 filed on Sep. 16, 2020, the entire contents of which are incorporated by reference herein.

TECHNICAL FIELD

The present invention relates to an optical concentration measurement device.

BACKGROUND ART

Conventionally, as gas measurement devices performing concentration measurement of a gas to be measured in the atmosphere, non-dispersive infrared type optical concentration measurement devices that, using a phenomenon that wavelength of infrared rays absorbed by a gas differs depending on the type of the gas, measure concentration of the gas by detecting the amount of absorption of the gas have been known.

For example, an optical concentration measurement device described in PTL 1 is configured to detect concentration of a gas to be measured according to an output signal from a light receiving unit by making light emitted by a light emitting unit incident on the light receiving unit via light collecting portions and reflection portions in a gas cell and, in so doing, introducing the gas to be measured into the gas cell.

CITATION LIST

Patent Literature

PTL 1: JP 2017-15567 A
PTL 2: JP H06-21485 A
PTL 3: JP 2010-122614 A

Non Patent Literature

NPL 1: Takaaki FURUYA, "Efficiency Improvement of Air Conditioning by Low Power Consumption $CO_2$ Gas Sensor Using Room Temperature Operation Quantum Mid-Infrared Sensor and LED", The 7th JACI/GSC Symposium, 2018/6

SUMMARY

In general, an optical concentration measurement device is required to be small size and low-cost, on one hand, and to be capable of providing continuously stable output with a precision of several ppm to several hundreds of ppm in an actual usage environment, on the other hand. Properties of the optical concentration measurement device important for achieving high precision include a signal-noise ratio (SNR). When temperature and humidity in an actual usage environment are high or an optical concentration measurement device is used under an environment where the optical concentration measurement device is subject to vibration, such as being used as an on-vehicle sensor, it is difficult to maintain high precision unless using an optical concentration measurement device having high robustness in the SNR.

For example, when, under an inferior usage environment, such as an environment where temperature and humidity are high and an environment where the optical concentration measurement device is subject to vibration, displacement or the like occurs in a relative positional relationship among a light emitting unit, a light guiding unit, and a light receiving unit because of deformation of a member supporting the light guiding unit due to high temperature, moisture absorption, vibration, or the like or expansion or contraction of a substrate on which the light emitting unit and the light receiving unit are mounted and, as a result thereof, the amount of light that reaches the light receiving unit changes, the SNR changes from a value upon shipment, causing error to be generated in a concentration measurement result of an object to be measured. Achievement of an optical concentration measurement device having a high SNR and high robustness in the SNR is substantially important for keeping a precision level of the optical concentration measurement device under an actual usage environment.

Optical light receiving devices that are configured to suppress distortion in a light receiving signal caused by deterioration in an amplification factor of a light receiving element by employing, as a method for improving precision, a method of defining spot diameter of incident light in such a way that a ratio of the spot diameter to light receiving diameter of the light receiving element becomes equal to or greater than a certain value have been proposed (see, for example, PTLs 2 and 3). However, since these light receiving devices are configured to enlarge spot diameter in order to decrease light intensity per unit area of incident light, there is still a problem in that, when, for example, the amount of displacement in a relative positional relationship among the light emitting unit, the light guiding unit, and the light receiving unit is large, the amount of received light deteriorates and the SNR also deteriorates.

Although a lamp has been hitherto used as a light source in optical concentration measurement devices, surface mount device (SMD) type mid-infrared LED light sources have been developed and mass produced recent years (from 2018 onward) and light sources the light source size of which is substantially small compared with a lamp and the light source shape of which is rectangular have come to be used (see, for example, NPL 1). While conventional lamps have sufficiently large spot size compared with light receiving element size and spot shapes thereof broaden in a rotationally symmetric shape, use of an LED light source causes the spot size of the LED light source to be equivalent to or equal to or less than the size of a light receiving surface of the light receiving unit and the spot shape thereof to become rectangular conforming with the shape of the light source, which causes a problem in that a corner portion of the rectangular shape of the spot being located out of the light receiving surface causes the SNR of the light receiving unit to deteriorate.

Accordingly, the present invention has been made in view of the conventional unsolved problem described above, and an object of the present invention is to provide an optical concentration measurement device capable of achieving a high SNR and high robustness of SNR.

According to an aspect of the present invention, there is provided an optical concentration measurement device including: an LED light source; a light receiving unit configured to have a rectangular light receiving surface having uniform sensitivity and output a single detection signal representing intensity of received light; and a light guiding unit configured to guide light emitted by the LED light source to the light receiving unit, wherein a shape of light on the rectangular light receiving surface, the light being radiated on the light receiving surface, is rectangular, the optical concentration measurement device measures concentration of an object to be measured existing in a light path formed by the light guiding unit, based on the detection signal output from the light receiving unit, and the light guiding unit guides light at a diffraction limit or greater in such a way that area of the light on the rectangular light receiving surface is ½ or less of area of the rectangular light receiving surface.

According to another aspect of the present invention, there is provided an optical concentration measurement device including: an LED light source; a light receiving unit configured to have a rectangular light receiving surface having uniform sensitivity and output a single detection signal representing intensity of received light; and a light guiding unit configured to guide light emitted by the LED light source to the light receiving unit, wherein a shape of light on the rectangular light receiving surface, the light being radiated on the light receiving surface, is rectangular, the optical concentration measurement device measures concentration of an object to be measured existing in a light path formed by the light guiding unit, based on the detection signal output from the light receiving unit, and the light guiding unit guides light in such a way that area of the light on the rectangular light receiving surface is twice or more area of the rectangular light receiving surface.

According to an aspect of the present invention, it is possible to achieve a high SNR and high robustness of SNR and to suppress of the deterioration of the measurement precision.

BRIEF DESCRIPTION OF DRAWINGS

FIGS. 13A to 13C are illustrative of an example of a spot radiated on the light receiving surface.

DETAILED DESCRIPTION

An embodiment of the present invention will now be described with reference to the drawings. In the following illustration of the drawings, the same or similar signs are assigned to the same or similar constituent components. However, the drawings are schematic, where a relation between thickness and planar dimensions and the like are different from actual ones. In addition, the following embodiment indicates devices and methods to embody the technical idea of the present invention byway of example, and the technical idea of the present invention does not limit the materials, shapes, structures, arrangements, and the like of the constituent components to those described below. The technical idea of the present invention can be subjected to a variety of alterations within the technical scope defined by the claims set forth in CLAIMS.

<Configuration of Optical Concentration Measurement Device>

Figure 1:
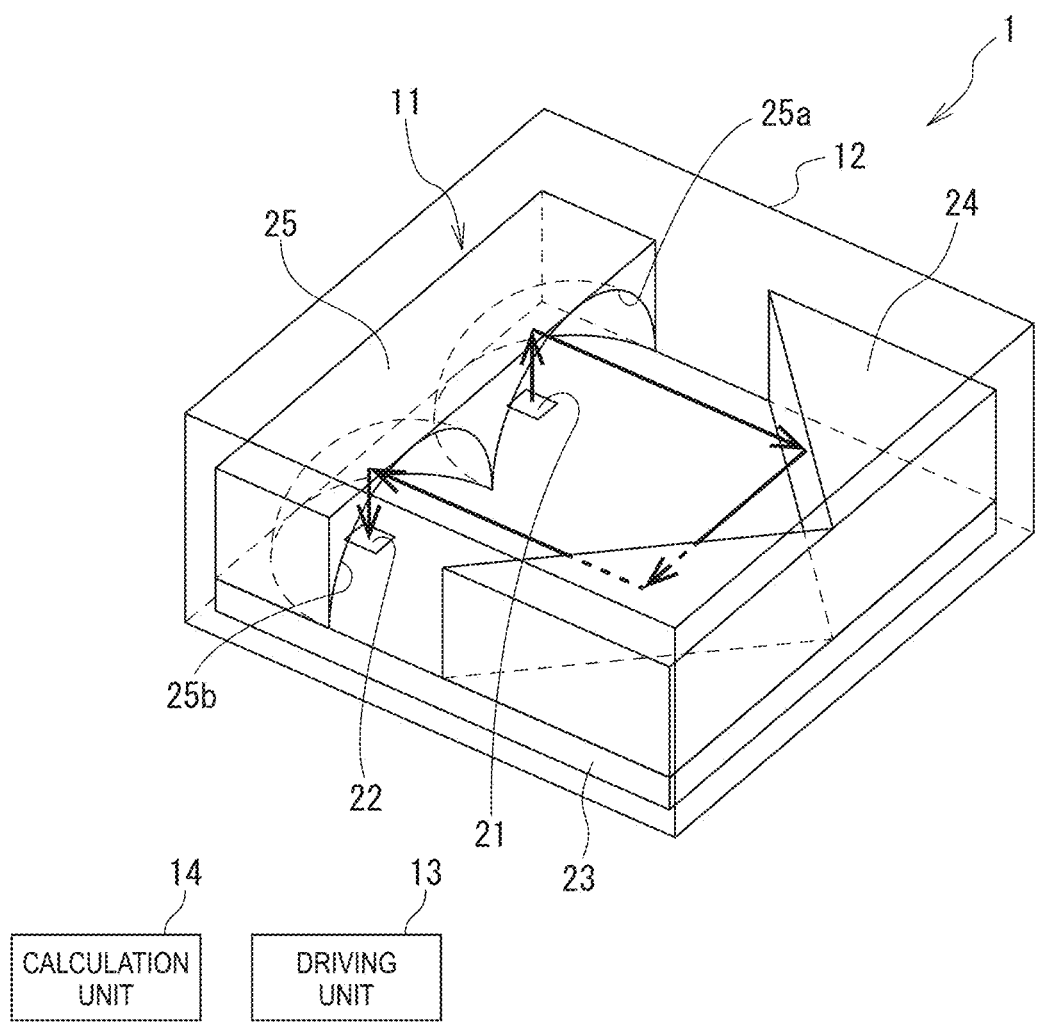
FIG. 1 is a schematic configuration diagram illustrative of an example of an optical concentration measurement device according to the present invention.

FIG. 1 is a schematic configuration diagram illustrative of an example of an optical concentration measurement device 1 according to an embodiment of the present invention. Although a case where an object to be measured is a gas will be described herein, the object to be measured may be a gas or a liquid. Any gas or liquid that has a property of absorbing light in a wavelength band of equal to or greater than 2 μm and equal to or less than 10 μm that is emitted by a light-emitting diode (LED) light source 21 may be applied.

The optical concentration measurement device 1 includes alight emitting and receiving device 11 and a housing 12 that houses the light emitting and receiving device 11. As illustrated in FIG. 1, the light emitting and receiving device 11 includes the cuboid-shaped LED light source 21, a cuboid-shaped light receiving unit 22 that is constituted by photodiodes or the like, a substrate 23 on which the LED light source 21 and the light receiving unit 22 are mounted, alight guiding unit 24, and a light guiding unit 25. The LED light source 21 emits light in a wavelength band of equal to or greater than 2 μm and equal to or less than 10 μm.

The light guiding unit 24 reflects light that is emitted by the LED light source 21 to the light receiving unit 22. The light guiding unit 25 includes a light collecting portion 25a for the LED light source 21 that collects light incident from the LED light source 21 and a light collecting portion 25b for the light receiving unit 22 that collects light reflected by the light guiding unit 24.

The light guiding units 24 and 25 have reflecting surfaces and are configured to guide light emitted by the LED light source 21 to the light receiving unit 22 only by means of reflection. Note that, although the optical concentration measurement device 1 illustrated in FIG. 1 is configured to guide light only by means of reflection using the light guiding units 24 and 25, the optical concentration measurement device 1 may use another type of optical elements, such as collecting light by means of a lens.

The optical concentration measurement device 1 is, by including the light guiding unit 25, configured to collect a greater amount of light emitted by the LED light source 21 by means of the light collecting portion 25a and reflect the collected light to the light guiding unit 24 and to collect a greater amount of light reflected by the light guiding unit 24 by means of the light collecting portion 25b and make the collected light incident on the light receiving unit 22.

The optical concentration measurement device 1 introduces gas to be measured from a not-illustrated gas inlet, which is disposed on the housing 12, to the inside of the housing 12, passes the gas to be measured through a light path linking the LED light source 21 and the light receiving unit 22 via the light guiding units 24 and 25, and discharges the gas to be measured from a not-illustrated gas outlet to the outside of the housing 12 and, in conjunction therewith, makes a driving unit 13 drive the LED light source 21 and a calculation unit 14 calculate a concentration of the gas to be measured, based on an output signal at this time from the light receiving unit 22.

The light emitting and receiving device 11 is, for example, fixed to the housing 12 by fixing the substrate 23 on the bottom surface of the housing 12, using adhesive made of resin and fixing the light guiding units 24 and 25 on the upper inner surface and the inner side surfaces of the housing 12, using adhesive made of resin.

Note that the driving unit 13 and the calculation unit 14 may be disposed inside the housing 12 or outside the housing 12 via wiring or the like.

The light path, through which light emitted by the LED light source 21 is guided to the light receiving unit 22, may be formed by disposing a plurality of mirrors in place of the light guiding units 24 and 25 and using the plurality of mirrors in combination. Materials of portions of the mirrors or the light guiding units 24 and 25 that are used as reflecting surfaces are preferably a metal or a multilayered dielectric material.

In each of the light guiding units 24 and 25, materials of portions where light is reflected and transmitted preferably have a reflectance and transmittance of equal to or greater than 90%, respectively.

Figure 2A:
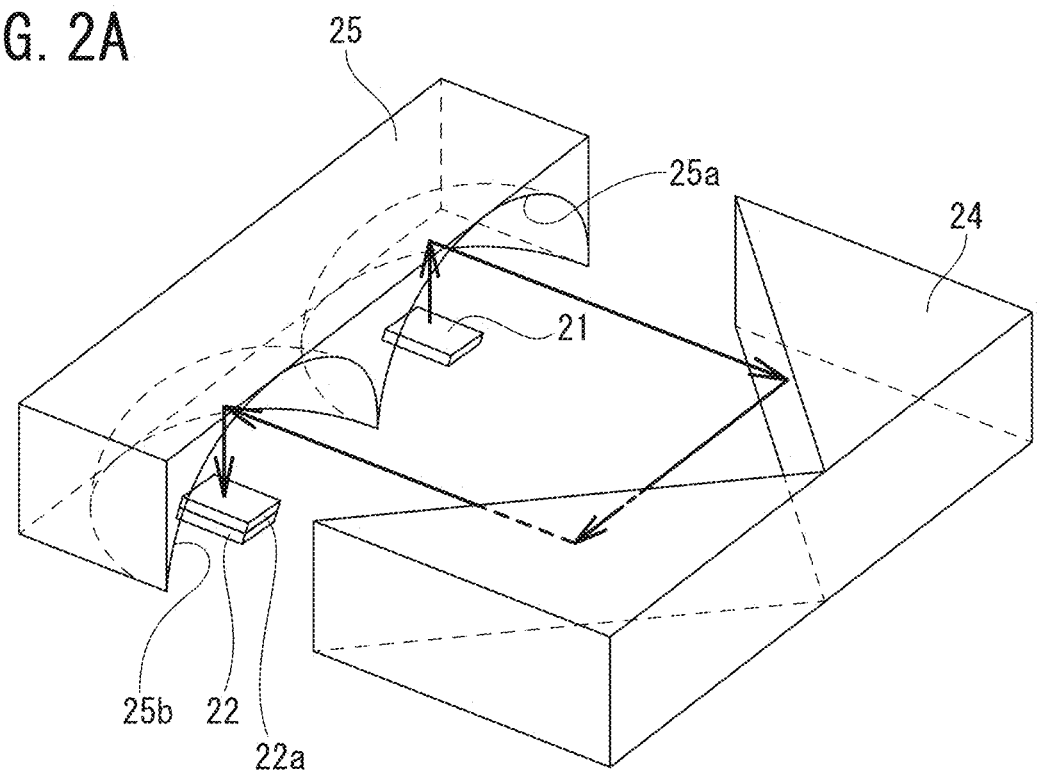
FIGS. 2A and 2B are illustrative of other examples of the optical concentration measurement device.
Figure 2B:
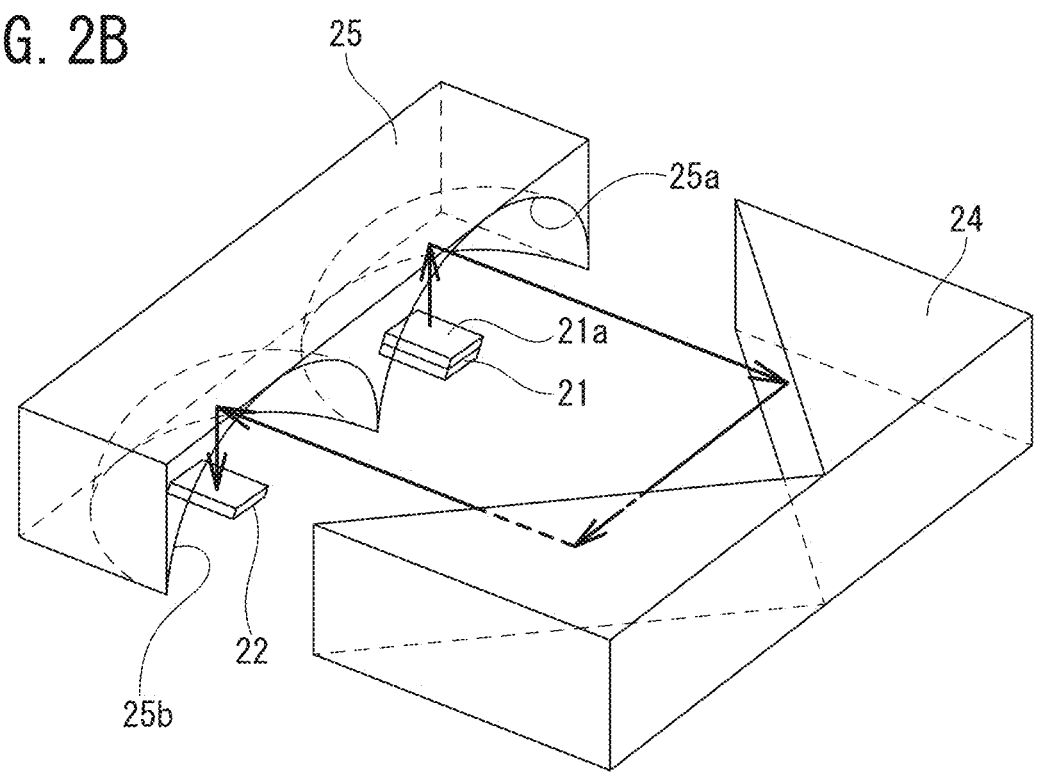

FIGS. 2A and 2B are illustrative of variations of the optical concentration measurement device 1.

As illustrated in FIG. 2A, the optical concentration measurement device 1 according to the embodiment of the present invention may include an optical filter 22a immediately above a light receiving surface of the light receiving unit 22. In other words, the optical concentration measurement device 1 may be provided with the optical filter 22a, such as a bandpass filter, that transmits only light in a wavelength band in which the light is absorbed by the gas to be measured and be configured to allow only light in the wavelength band in which the light is absorbed by the gas to be measured to be incident on the light receiving unit 22.

Alternatively, the optical concentration measurement device 1 according to the embodiment of the present invention may include an optical filter 21a immediately above the LED light source 21, as illustrated in FIG. 2B, instead of immediately above the light receiving surface of the light receiving unit 22. In other words, the optical concentration measurement device 1 may be provided with the optical filter 21a, such as a bandpass filter, that transmits only light in a wavelength band in which the light is absorbed by the gas to be measured and be configured to allow only light in the wavelength band in which the light is absorbed by the gas to be measured to be incident on the light guiding units 24 and 25. Note that FIGS. 2A and 2B illustrate only an optical system of the optical concentration measurement device 1 and components other than the optical system are the same as those in the configuration of the optical concentration measurement device 1 illustrated in FIG. 1.

Still alternatively, the optical concentration measurement device 1 may be provided with a grating as a portion of the light guiding units and be configured to guide only light in a wavelength band in which the light is absorbed by the gas to be measured by means of the grating.

Figure 3:
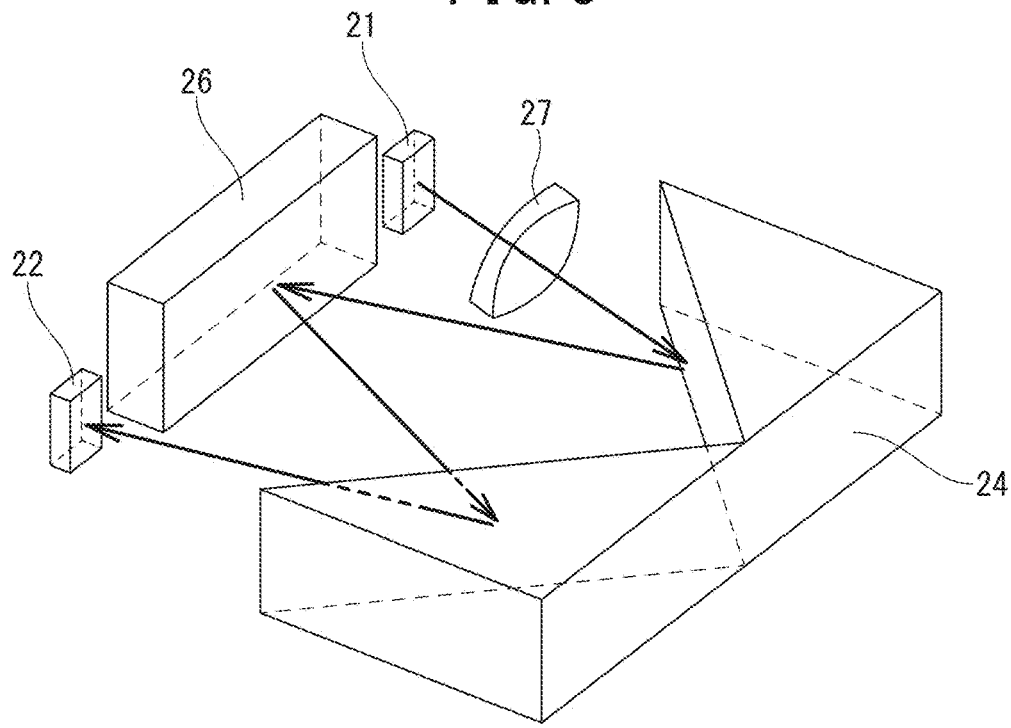
FIG. 3 is illustrative of still another example of the optical concentration measurement device.

Still alternatively, as illustrated in FIG. 3, the optical concentration measurement device 1 may be provided with a light guiding unit 26 between the LED light source 21 and the light receiving unit 22, in place of the light guiding unit 25 in FIGS. 2A and 2B. In other words, the LED light source 21 and the light receiving unit 22 are disposed on both sides of the light guiding unit 26 and, in conjunction therewith, a lens 27 that collects light emitted by the LED light source 21 is disposed, and the light guiding unit 26, the LED light source 21, and the light receiving unit 22 are arranged in such away that a reflecting surface of the light guiding unit 26, a light emitting surface of the LED light source 21, and a light receiving surface of the light receiving unit 22 face reflecting surfaces of the light guiding unit 24. Light emitted by the LED light source 21 is collected by the lens 27, is incident on the light guiding unit 24, is reflected by the light guiding unit 24, and is incident on the light guiding unit 26. The light guiding unit 26 reflects the incident light to the light guiding unit 24, and the light guiding unit 24 reflects the incident light to the light receiving unit 22.

Note that FIG. 3 is illustrative of only the optical system of the optical concentration measurement device 1 and components other than the optical system are the same as those in the configuration of the optical concentration measurement device 1 illustrated in FIG. 1.

<Relationship Between Area of Rectangular Light Receiving Surface and Area of Light on Rectangular Light Receiving Surface>

Next, a relationship between area of the light receiving surface of the light receiving unit 22 and area of light on the light receiving surface of the light receiving unit 22, the light being radiated on the light receiving surface, will be described. Note that, hereinafter, the area of the light receiving surface is referred to as sensor area. Light that is actually radiated on the light receiving surface of the light receiving unit 22 is referred to as a spot, and area of the light actually radiated on the light receiving surface, that is, area of the spot, is referred to as spot area.

In the optical concentration measurement device 1 according to the present embodiment, the shape of light on the light receiving surface of the light receiving unit 22, the light being radiated on the light receiving surface, is formed into a rectangle. The spot size referred to above refers to size of rectangular light radiated on the light receiving surface of the light receiving unit 22. The shape on the light receiving surface of the light radiated on the light receiving surface can be formed into a rectangle by, for example, arranging a plurality of LEDs as the LED light source 21 in such a way that density per unit area of the plurality of LEDs becomes high and a light emitting surface that the plurality of LEDs form is formed into a rectangle or disposing a viewing angle restriction element (not illustrated) for defining a spot size, for example, between the LED light source 21 and the light collecting portion 25a, between the light receiving unit 22 and the light collecting portion 25b, or between the light guiding unit 24 and the light guiding unit 25 in the light path between the LED light source 21 and the light receiving unit 22.

Figure 4:
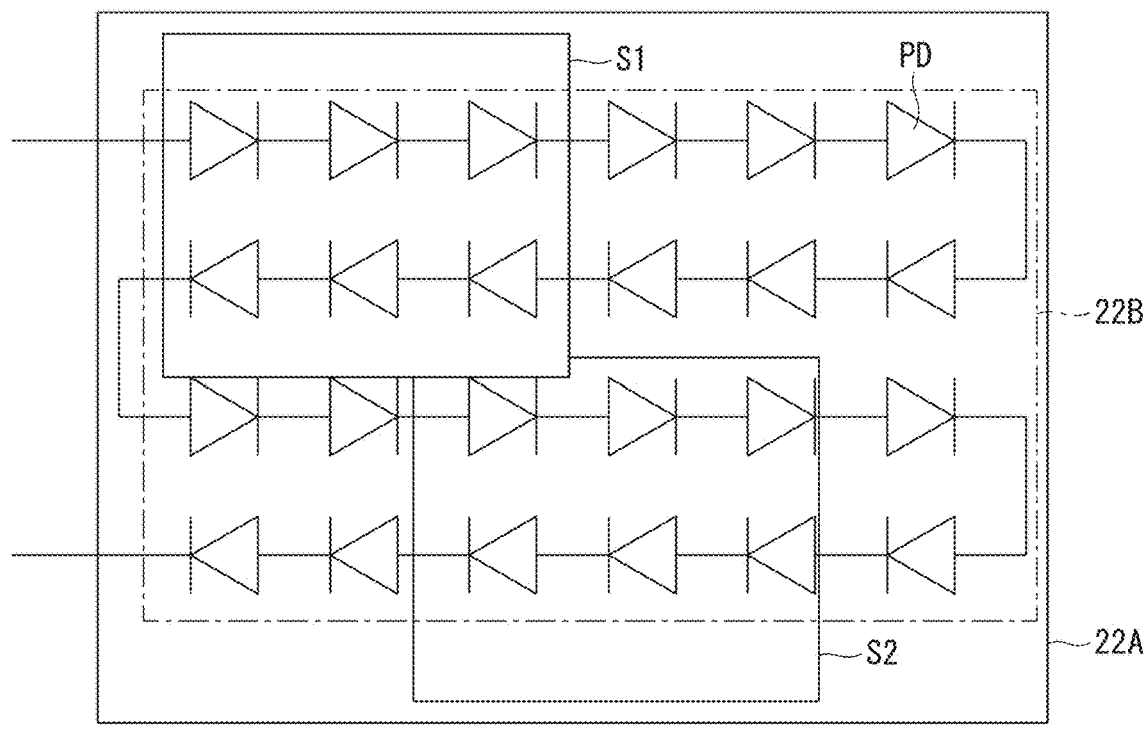
FIG. 4 is an explanatory diagram for a description of a configuration of a light receiving unit.

As illustrated in FIG. 4, the light receiving unit 22 is formed with a plurality of photodiodes PD connected in series, and the plurality of photodiodes PD are arranged in such a way that the plurality of photodiodes PD form a rectangular light receiving surface 22A as a whole. The total sum of outputs of the plurality of photodiodes PD is output as a single detection signal of the light receiving unit 22. Therefore, for example, as illustrated in FIG. 4, a detection signal of the light receiving unit 22 when the spot size on the light receiving surface 22A is equal to the size of a rectangular region S1 is the same as a detection signal when the spot size is equal to the size of a rectangular region S2 that is a region having the same shape as the rectangular region S1. That is, the light receiving unit 22 has the light receiving surface 22A having uniform sensitivity.

Figure 5:
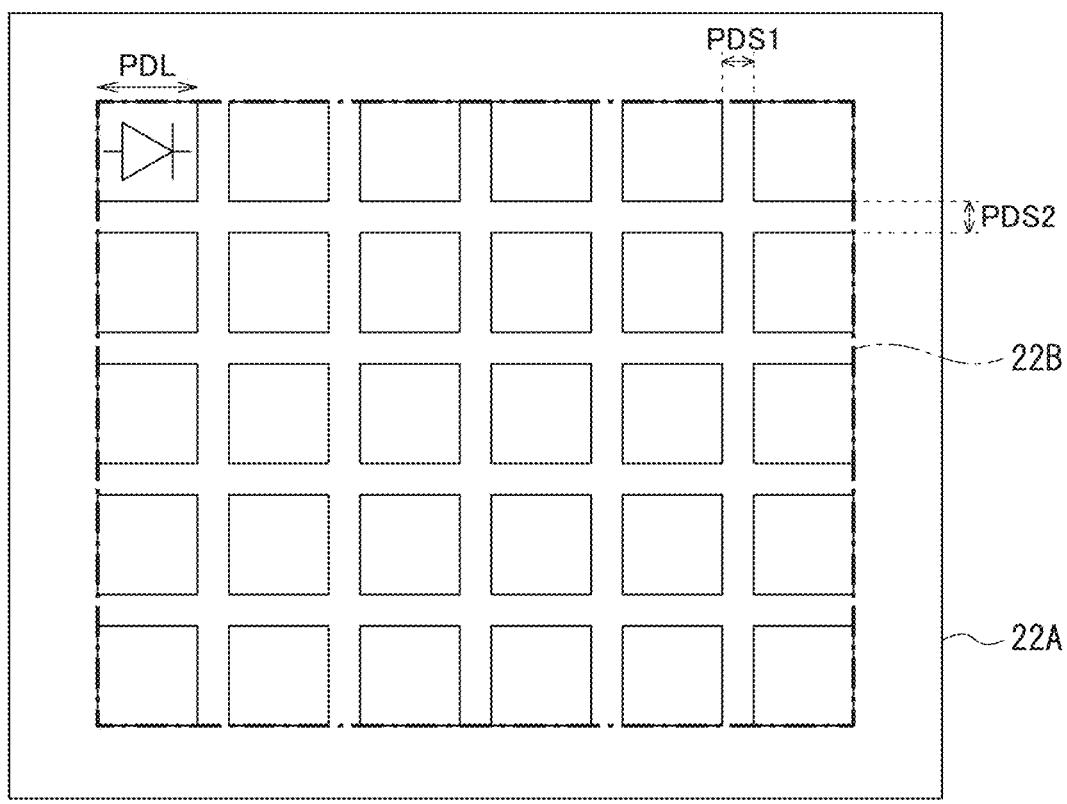
FIG. 5 is an explanatory diagram for a description of sensitivity of a light receiving surface.

The light receiving surface 22A having uniform sensitivity will be described, taking FIG. 5 into consideration. The light receiving surface 22A having uniform sensitivity means that photodiodes of the same size are lined up vertically and horizontally with spaces (PDS1 and PDS2) 70% or less of a short side PDL of each photodiode interposed between adjacent photodiodes or that area 22B of a smallest convex polygon containing the outer perimeters of the photodiodes occupies 50% or greater of the area of the light receiving surface 22A.

From the perspective of design concept, the optical concentration measurement device 1 is configured to guide light emitted by the LED light source 21 to the light receiving unit 22 in such a way that the center of a rectangular spot radiated on the light receiving surface 22A coincides with the center of the rectangular light receiving surface 22A and the sides of the light receiving surface 22A are respectively aligned parallel with the sides of the spot.

The spot size is set in such a way that length of a side of the spot is set at a value within a region AR1 or a region AR2 illustrated in FIG. 6A when the light receiving surface 22A of the light receiving unit 22 is a rectangle a side of which is A (μm) (hereinafter, it is also described that the light receiving surface size is A (μm)).

Figure 6A:
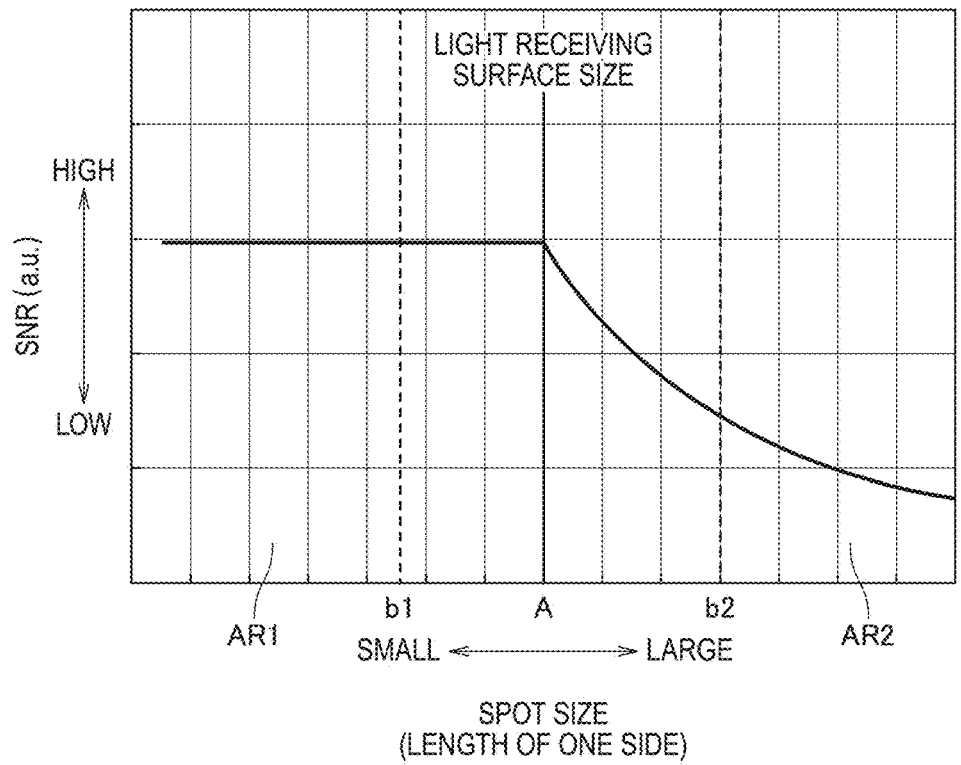
FIGS. 6A and 6B are explanatory diagrams for a description of a relationship among the light receiving surface, a spot, and an SNR.

FIG. 6A illustrates a relationship between length of a side of a spot, which represents spot size, and an SNR when the light receiving surface size is A (μm), and the abscissa and the ordinate represent the length (μm) of a side of a spot and the SNR (a.u.), respectively.

When the light receiving surface size is A (μm) and the spot size is equal to or less than the light receiving surface size, the SNR becomes substantially constant. In other words, all the light radiated to the light receiving unit 22 is predicted to be incident on the light receiving surface and the amount of received light becomes constant, causing the SNR to also become constant. On the other hand, when the spot size becomes larger than the light receiving surface size, the amount of received light decreases because the light receiving unit 22 cannot receive all the light radiated to the light receiving surface, associated with which the SNR also deteriorates. Since the larger the spot size becomes than the light receiving surface size, the smaller the amount of light radiated on the light receiving surface becomes, the SNR deteriorates associated with increase in the spot size. Note that the amount of light emitted by the LED light source 21 is constant.

In the optical concentration measurement device 1 having a property illustrated in FIG. 6A, the spot size is set at a value in the region AR1 within which the spot size is equal to or less than b1 that is less than A (μm), which is the light receiving surface size, or a value in the region AR2 within which the spot size is equal to or greater than b2 that is greater than A (μm), which is the light receiving surface size.

Figure 6B:
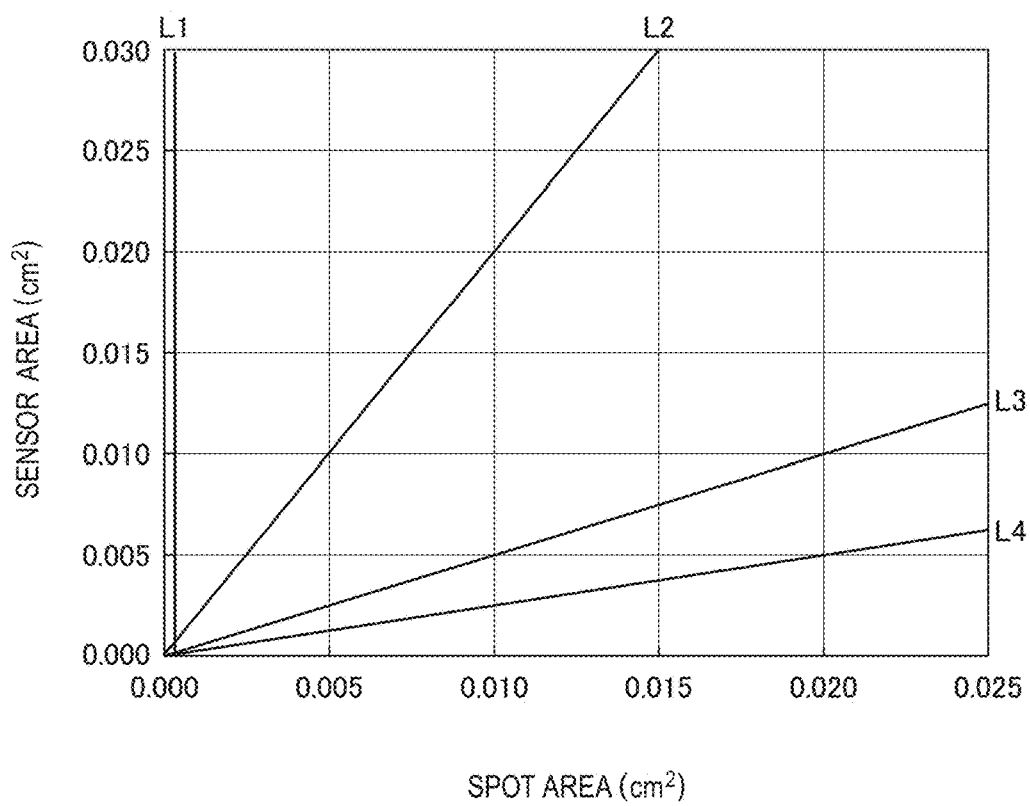

FIG. 6B is a diagram expressive of the region AR1 and the region AR2 by means of sensor area that is area of the light receiving surface and spot area that is area of the spot, and the abscissa and the ordinate represent the spot area (cm²) and the sensor area (cm²), respectively.

As illustrated in FIG. 6B, the region AR1 corresponds to a region sandwiched by a characteristic line L1 and a characteristic line L2, and the region AR2 corresponds to a region sandwiched by a characteristic line L3 and a characteristic line L4.

The characteristic lines L1 to L4 are determined as described below.

<Characteristic Line L1>

The characteristic line L1 represents a relationship between the sensor area and the spot area when the spot size is minimized, that is, the spot is formed at a diffraction limit. In other words, it is predicted that, if the spot size is minimized, the spot is entirely contained within the light receiving surface and the amount of received light does not decrease even when the spot is shifted to a certain extent. Therefore, it is possible to secure a desirable SNR and also to secure high robustness. From the above description, when it is assumed that the spot size (length of aside of the spot) is denoted by b, a value of "b" in the case of the characteristic line L1, that is, when the spot size is minimized, is expressed by the following formula (1). In the formula (1), λ denotes wavelength (equal to or greater than 2 μm and equal to or less than 10 μm), and NA denotes a numerical aperture.

$$b = 2 \times (0.61 \times \lambda)/(NA) \tag{1}$$

<Characteristic Line L2>

Figure 7:
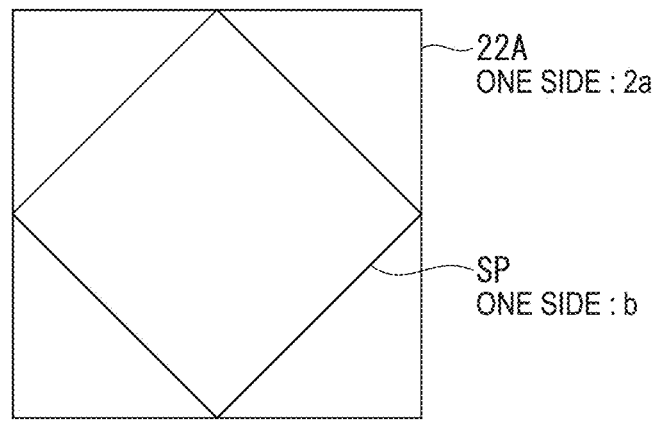
FIG. 7 is an explanatory diagram for a description of the relationship in FIGS. 6A and 6B.

The characteristic line L2 is a characteristic line defined assuming a case where a spot SP rotates with respect to the light receiving surface 22A as illustrated in FIG. 7 and indicates a condition under which a desirable SNR can be maintained even when the spot SP rotates with respect to the light receiving surface 22A. In other words, it is predicted that, even when the spot SP rotates 360 degrees with respect to the light receiving surface 22A, the amount of received light does not change if the spot SP is entirely contained within the light receiving surface 22A when the spot SP rotates 45 degrees with respect to the light receiving surface 22A. Therefore, it is possible to secure a desirable SNR and also to secure high robustness. From the above description, when it is assumed that the length of a side of the light receiving surface 22A is 2a, the spot size and the light receiving surface size are only required to satisfy the following formula (2).

$$b = 2^{1/2} \times a \tag{2}$$

Under the above definitions, the sensor area and the spot area are expressed as $4a^2$ and $b^2$, respectively.

Therefore, from the formula (2), the characteristic line L2 can be expressed by the following formula (3).

$$\text{Spot area/sensor area} = b^2/4a^2 = \tfrac{1}{2} \tag{3}$$

Figure 8:
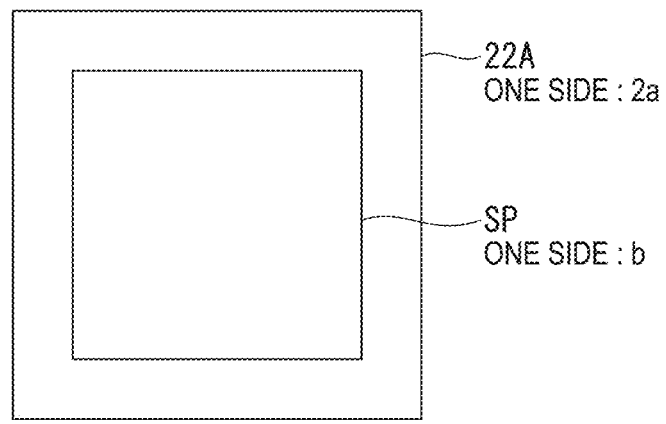
FIG. 8 is another explanatory diagram for a description of the relationship in FIGS. 6A and 6B.

In addition, as illustrated in FIG. 8, even when the spot SP, instead of rotating, is shifted vertically and/or horizontally with respect to the light receiving surface 22A, setting the spot area and the sensor area in such a way that the spot area and the sensor area satisfy the formula (3) enables the spot SP to be entirely contained within the light receiving surface 22A even when a shift to a certain extent occurs. That is, it is possible to secure a desirable SNR and, in conjunction therewith, to secure comparatively high robustness.

<Characteristic Line L3>

Figure 9:
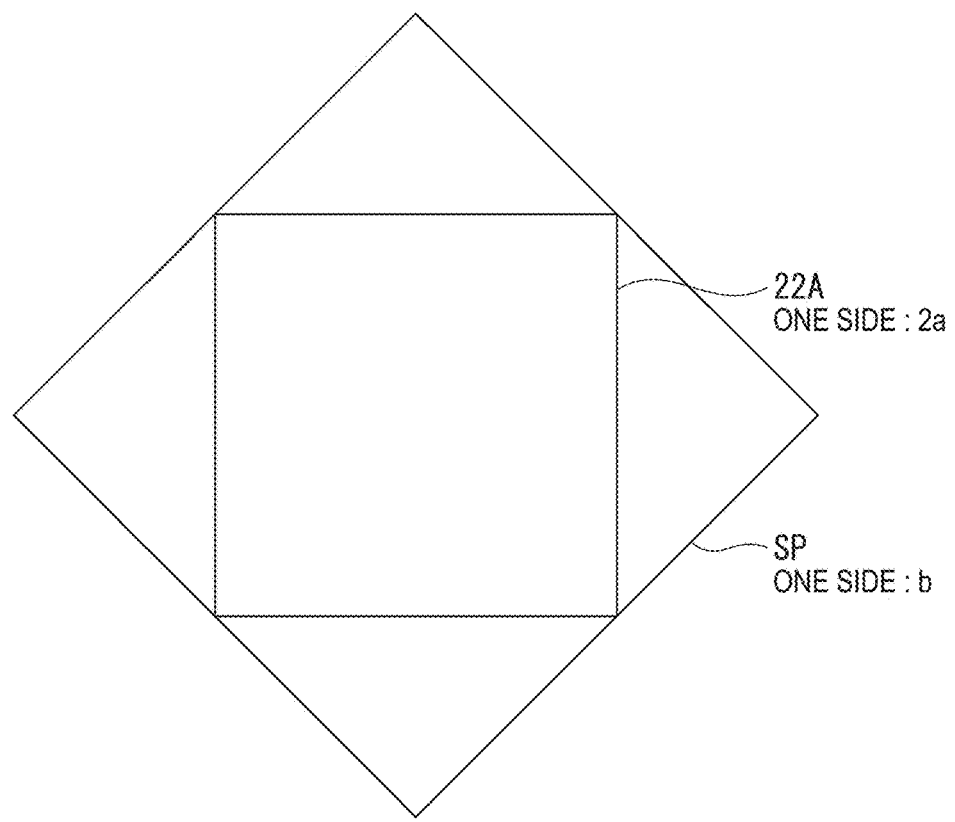
FIG. 9 is still another explanatory diagram for a description of the relationship in FIGS. 6A and 6B.

The characteristic line L3 is a characteristic line defined assuming a case where the spot size is larger than the light receiving surface size as illustrated in FIG. 9 and indicates a condition under which a desirable SNR can be maintained even when the spot SP rotates. In other words, it is predicted that, even when the spot SP rotates 360 degrees with respect to the light receiving surface 22A, the amount of received light does not change if the light receiving surface 22A is entirely contained within the spot SP when the spot SP rotates 45 degrees with respect to the light receiving surface 22A. In other words, it is possible to secure a desirable SNR and also to secure high robustness. From the above description, the spot size and the light receiving surface size are only required to satisfy the following formula (4).

$$b=2\times2^{1/2}\times a \quad (4)$$

Under the above definitions, the sensor area and the spot area are expressed as $4a^2$ and $b^2$, respectively.

Therefore, from the formula (4), the characteristic line L3 can be expressed by the following formula (5).

$$\text{Spot area/sensor area}=b^2/4a^2=2 \quad (5)$$

Figure 10:
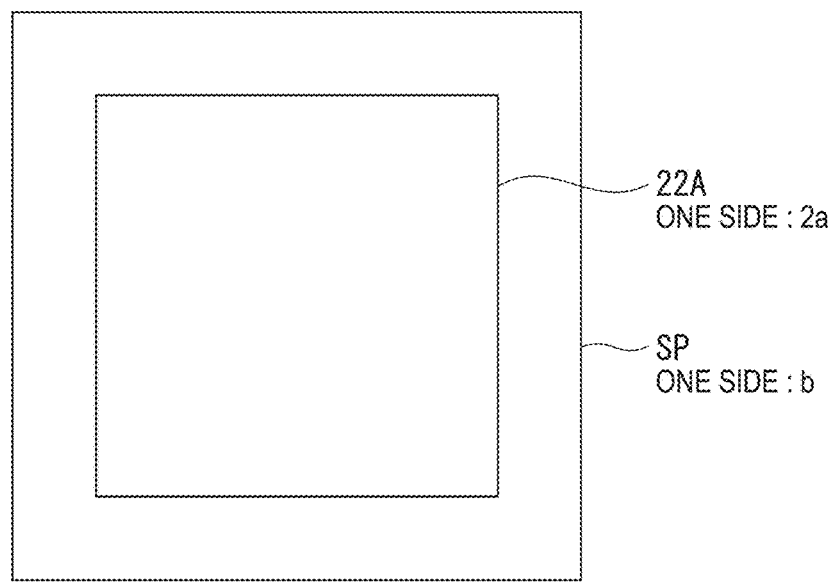
FIG. 10 is still another explanatory diagram for a description of the relationship in FIGS. 6A and 6B.

In addition, as illustrated in FIG. 10, even when the spot SP, instead of rotating, is shifted vertically and/or horizontally with respect to the light receiving surface 22A, setting the spot area and the sensor area in such a way that the spot area and the sensor area satisfy the formula (5) enables the light receiving surface 22A to be entirely contained within the spot SP even when a shift to a certain extent occurs. That is, it is possible to secure a desirable SNR and, in conjunction therewith, to secure comparatively high robustness.

<Characteristic Line L4>

Figure 11:
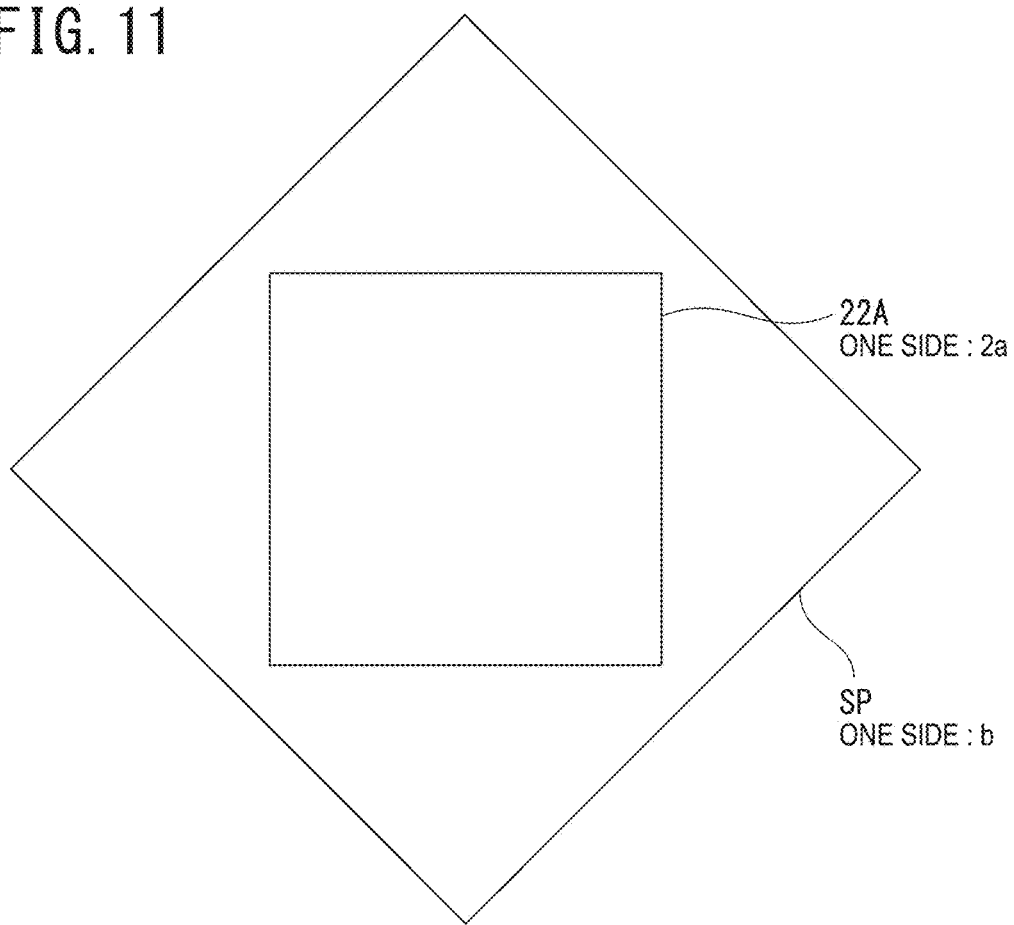
FIG. 11 is still another explanatory diagram for a description of the relationship in FIGS. 6A and 6B.

The characteristic line L4 is a characteristic line defined assuming a condition under which, as illustrated in FIG. 11, the SNR becomes half the SNR in the case of the characteristic line L3, which is expressed by the formula (5). In other words, when it is assumed that an allowable range of values for the SNR contains values down to half the SNR in the case of the characteristic line L3, the characteristic line L4 indicates a condition under which the SNR takes a value half the SNR in the case of the characteristic line L3. The SNR taking a value half the SNR in the case of the characteristic line L3 is equivalent to the amount of received light having decreased to half. Thus, since the overall amount of light in the spot SP is constant regardless of the size of the spot SP, the spot area becomes twice as large as a spot area calculated with the characteristic line L3, causing a state in which the light receiving surface 22A is entirely contained within the spot SP, as illustrated in FIG. 11.

Therefore, the characteristic line L4 can be expressed by the following formula (6) from the formula (5).

$$\text{Spot area/sensor area}=4 \quad (6)$$

Figure 12:
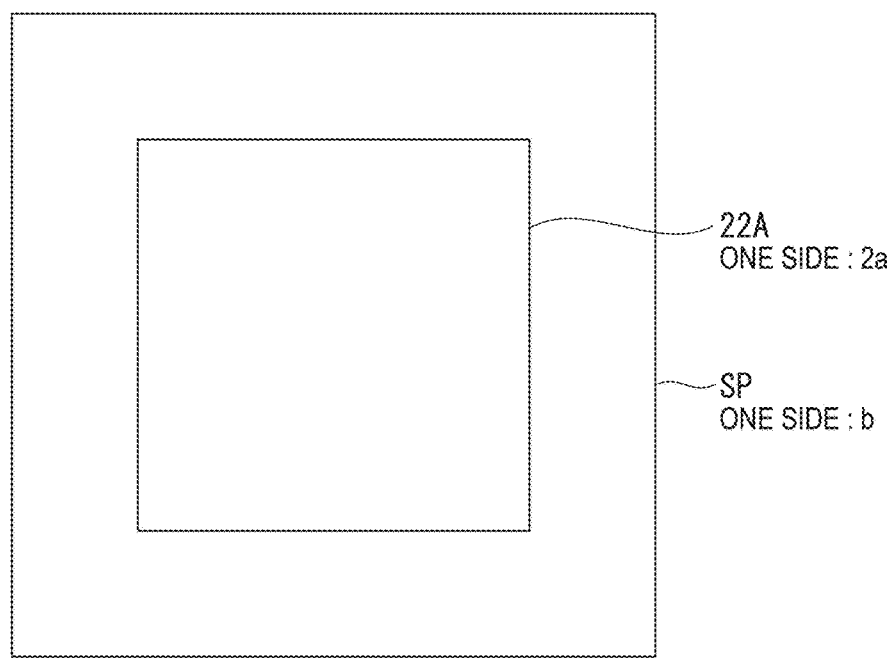
FIG. 12 is still another explanatory diagram for a description of the relationship in FIGS. 6A and 6B.

In addition, it is predicted that, as illustrated in FIG. 12, even when the spot SP, instead of rotating, is shifted vertically and/or horizontally with respect to the light receiving surface 22A, setting the spot area and the sensor area in such a way that the spot area and the sensor area satisfy the formula (6) enables a state in which the light receiving surface 22A is entirely contained within the spot SP to be maintained even when a shift to a certain extent occurs. That is, it is possible to secure a desirable SNR and, in conjunction therewith, to secure comparatively high robustness.

From the above description, in "a region in which the SNR is constant and the robustness of the SNR is comparatively high", that is, a region sandwiched by the characteristic lines L1 and L2, which corresponds to the region AR1 in FIG. 6A, it is only required that the size of a spot formed by light being radiated on the light receiving surface is equal to or greater than a spot formed at the diffraction limit and the ratio of the spot area to the sensor area is equal to or less than ½.

In the region AR1, when the total amount of light in the spot is constant, the smaller the spot area becomes, the greater the robustness is improved.

Thus, in a region corresponding to the region AR1, it is preferable that the spot size be equal to or greater than a spot formed at the diffraction limit and the ratio of the spot area to the sensor area be equal to or less than ¼, and it is more preferable that the spot size be equal to or greater than a spot formed at the diffraction limit and the ratio of the spot area to the sensor area be equal to or less than ⅙.

The above conditions are preferable because the length of a side of the spot under the conditions respectively becomes $\frac{1}{2}^{1/2}$ and $\frac{1}{3}^{1/2}$ times as long as that in the case of the characteristic line L2 in FIG. 6B, causing higher robustness of the SNR.

In addition, in a region in which the SNR is not constant although the robustness of the SNR is high, that is, a region sandwiched by the characteristic lines L3 and L4, which corresponds to the region AR2 in FIG. 6A, it is only required that the spot area and the sensor area satisfy that "the ratio of the spot area to the sensor area is equal to or greater than 2 and equal to or less than 4".

In the region AR2, when the total amount of light in the spot is constant, the larger the spot area becomes, the greater the robustness is improved but the less the amount of light incident on the light receiving unit becomes. Considering that optical performance of the LED light source and the light receiving unit deteriorates due to temperature characteristics within an operating temperature range, causing the SNR to deteriorate, it is more preferable that "the ratio of the spot area to the sensor area be equal to or greater than 2 and equal to or less than 3", in a region corresponding to the region AR2 in FIG. 6B.

Note that, although the characteristic lines L1 to L4 set conditions of the relationship between the spot area and the sensor area under the assumption that the light receiving surface is substantially square and a spot reaching the light receiving surface is substantially square, the light receiving surface and the spot, without being necessarily square, are only required to be rectangular. When the light receiving surface 22A and the spot SP are rectangular, that is, a constant SNR is to be achieved by making the spot SP entirely contained in the light receiving surface 22A, it is only required to define the characteristic lines L1 and L2, assuming the length of a short side of the light receiving surface 22A to be "a" and the length of a long side of the spot SP to be "b". Conversely, when the SNR is to be maintained at a comparatively high level by making the light receiving surface 22A entirely contained in the spot SP, it is only required to define the characteristic lines L3 and L4, assuming the length of a long side of the light receiving surface 22A to be "a" and the length of a short side of the spot to be "b".

<Definition of Spot Size>

Next, a definition of the spot size will be described.

When, as illustrated in FIG. 13A, the center of the rectangular light receiving surface 22A is assumed to be the origin (x0, y0) and the position of each point on the light receiving surface 22A is represented by (x, y) coordinates with the origin set at (x0, y0), irradiance at each coordinate position on the light receiving surface 22A can be approximated by the following formula (7). Note that, in FIG. 13A, a region C1 denotes a spot radiated on the light receiving surface 22A, a region C2 denotes a region in which no spot is radiated within the light receiving surface 22A, and a region C3 denotes a region at the boundary between the region in which the spot is radiated and the region in which no spot is radiated within the light receiving surface 22A.

[Math. 1]

$$f_{(x,y)} = \frac{P}{2}\left(\frac{2}{\pi}\tan^{-1}\left(\frac{1 - \sqrt[n]{\left(\frac{x-x_0}{\beta}\right)^n + \left(\frac{y-y_0}{\gamma}\right)^n}}{\alpha}\right) + 1\right) \quad (7)$$

P: peak value
α: degree of sharpness of edges
β: half-width in the x-axis direction
γ: half-width in the y-axis direction
n: even number of 2 or more FIG. 13B is a graph illustrative of simulated values of the irradiance in a cross-section along the x-direction in FIG. 13A, and FIG. 13C is a graph illustrative of simulated values of the irradiance in a cross-section along the y-direction in FIG. 13A. In FIG. 13B, the abscissa represents distance (μm) from the origin (x0, y0) in the x-direction in the cross-section along the x-direction in FIG. 13A, and the ordinate represents the irradiance (W/cm²). In FIG. 13C, the abscissa represents distance (μm) from the origin (x0, y0) in the y-direction in the cross-section along the y-direction in FIG. 13A, and the ordinate represents the irradiance (W/cm²).

Values of the respective variables in the formula (7) can be calculated from irradiance values at respective coordinate positions illustrated in FIGS. 13B and 13C and the formula (7). For example, it is only required to calculate values of the respective variables from the simulated values of the irradiance as illustrated in FIGS. 13B and 13C and the formula (7), using a least-square method or the like and to calculate a length in the x-axis direction and a length in the y-axis direction of the rectangular spot SP from the half-width β in the x-axis direction and the half-width γ in the y-axis direction.

Figure 14A:
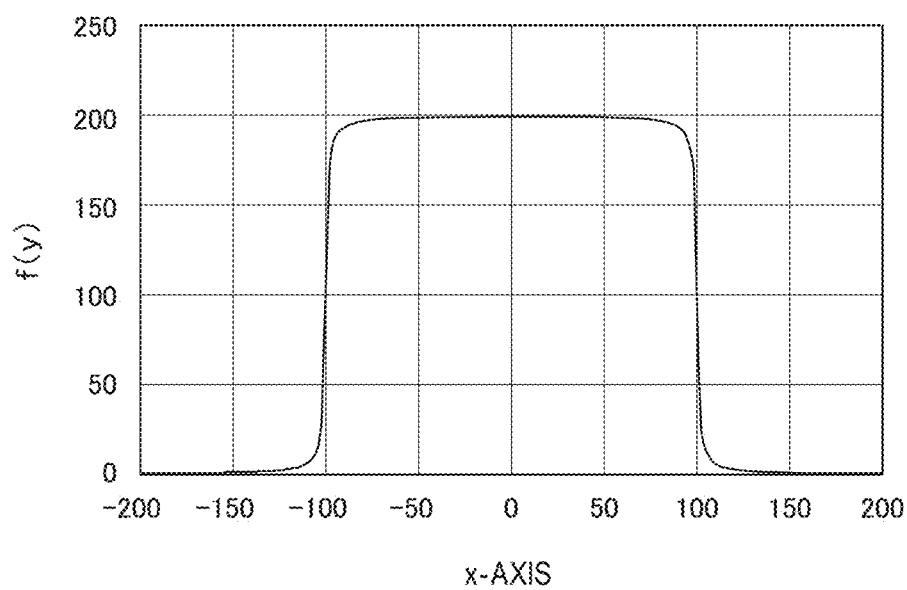
FIGS. 14A and 14B are illustrative of examples of irradiance in a cross-section along the x-direction of a spot calculated by the formula (7).
Figure 14B:
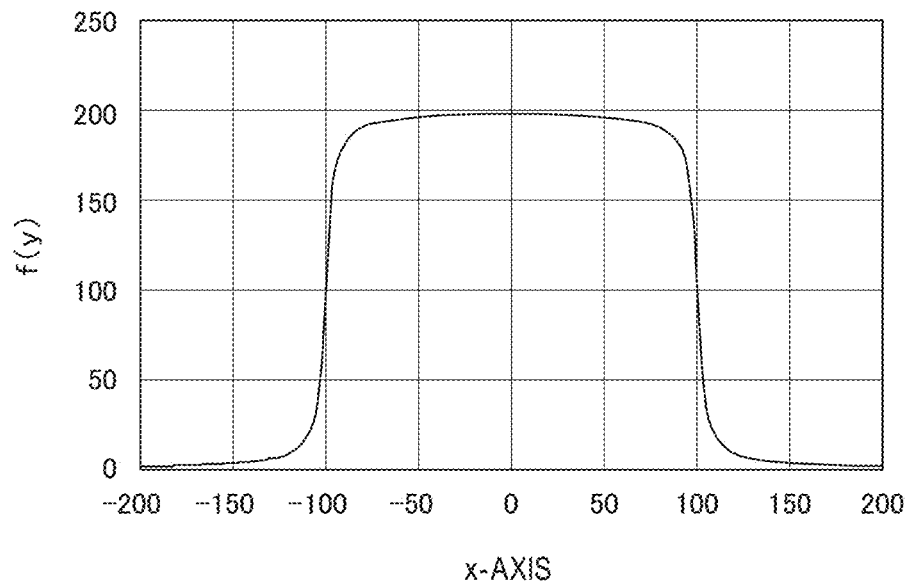

"α: degree of sharpness of edges" in the formula (7) is a variable defining whether or not edges change sharply as illustrated in, for example, FIGS. 14A and 14B, and edges in the case of a small degree α of sharpness of edges (FIG. 14A) change more sharply than those in the case of a large degree α of sharpness of edges (FIG. 14B). In FIGS. 14A and 14B, the abscissa represents the distance (μm) from the origin (x0, y0) in the x-direction, which corresponds to the abscissa in FIG. 13B, and the ordinate represents f(y) that is irradiance in the cross-section along the x-direction.

Advantageous Effects

As described above, in the optical concentration measurement device 1 according to the embodiment of the present invention, a ratio between the sensor area, which is area of the rectangular light receiving surface of the light receiving unit 22, and the spot area, which is area of a rectangular spot, is defined, and a ratio is set at which it is predicted that a desirable SNR can be secured and comparatively high robustness can be secured even when a relative positional relationship between the light receiving surface and the spot is shifted. Thus, even when the relative positional relationship between the light receiving surface and the spot is shifted from a state set upon shipment due to change in an environment, such as humidity and temperature, vibration, or the like, it is possible to maintain a desirable SNR. In addition, a design concept requires the positional relationship between the light receiving surface and the spot to satisfy that the center of the rectangular light receiving surface coincides with the center of the rectangular spot and the sides of the light receiving surface are respectively in parallel with the sides of the spot, and, assuming a case where an actual positional relationship is made different from the positional relationship in accordance with the design concept, a ratio between the sensor area and the spot area is determined in such a way as to secure comparatively high robustness even when the spot is shifted vertically and/or horizontally with respect to the light receiving surface or the spot rotates with respect to the light receiving surface. Thus, it is possible to prevent the SNR from deteriorating. In other words, it is possible to achieve the optical concentration measurement device 1 that secures a desirable SNR and has comparatively high robustness. Since it is possible to prevent the SNR from deteriorating even when, for example, a shift of the relative positional relationship between the light receiving surface and the spot occurs due to not only a change in an environment, such as humidity and temperature, but also vibration or the like, it is also possible to prevent the SNR from deteriorating even when the optical concentration measurement device is applied to an on-vehicle sensor or the like and to thereby increase general versatility thereof to a higher level.

Since it is possible to secure comparatively high robustness, it is possible to achieve a desirable SNR even when assembly error or the like occurs at the time of production.

When the LED light source 21 and the light receiving unit 22 are surface mount device (SMD) type elements, a comparatively smaller amount of solder is needed to mount the elements on the substrate than in the case of mounting insertion-type elements (for example, metal CAN type elements), causing a tolerance component in the height direction at the time of mounting to be small. Error between an ideal mounting position and an actual mounting position in the height direction has a comparatively substantial influence on the SNR. Thus, to achieve high robustness of SNR as described in the above embodiment, it is preferable to mount SMD type elements instead of insertion type elements (for example, metal CAN type elements). Selection of an SMD type element enables the tolerance in the height direction to be suppressed and fluctuation of the SNR to be suppressed. As used herein, the height is the thickness direction with respect to a mounting surface in the element mounting.

Although an embodiment of the present invention was described above, the above-described embodiment indicates devices and methods to embody the technical idea of the present invention by way of example, and the technical idea of the present invention does not limit the materials, shapes, structures, arrangements, and the like of the constituent components to specific ones. The technical idea of the present invention can be subjected to various modifications within the technical scope defined by the claims set forth in CLAIMS.

REFERENCE SIGNS LIST

1 Optical concentration measurement device
11 Light emitting and receiving device
12 Housing
21 LED light source
22 Light receiving unit
23 Substrate
24, 25, 26 Light guiding unit
25a, 25b Light collecting portion
27 Lens

The invention claimed is:

1. An optical concentration measurement device comprising:
   an LED light source;
   a light receiving unit configured to have a rectangular light receiving surface having uniform sensitivity and output a single detection signal representing intensity of received light; and
   a light guiding unit configured to guide light emitted by the LED light source to the light receiving unit, wherein
   a shape of light on the rectangular light receiving surface, the light being radiated on the light receiving surface, is rectangular,
   the optical concentration measurement device measures concentration of an object to be measured existing in a light path formed by the light guiding unit, based on the detection signal output from the light receiving unit, and
   the light guiding unit guides light at a diffraction limit or greater in such a way that area of the light on the rectangular light receiving surface is ½ or less of area of the rectangular light receiving surface.

2. The optical concentration measurement device according to claim 1, wherein
   the light guiding unit guides light at the diffraction limit or greater in such a way that area of the light on the rectangular light receiving surface is ¼ or less of area of the rectangular light receiving surface.

3. The optical concentration measurement device according to claim 1, wherein
   the light guiding unit guides light at the diffraction limit or greater in such a way that area of the light on the rectangular light receiving surface is ⅙ or less of area of the rectangular light receiving surface.

4. An optical concentration measurement device comprising:
   an LED light source;
   a light receiving unit configured to have a rectangular light receiving surface having uniform sensitivity and output a single detection signal representing intensity of received light; and
   a light guiding unit configured to guide light emitted by the LED light source to the light receiving unit, wherein
   a shape of light on the rectangular light receiving surface, the light being radiated on the light receiving surface, is rectangular,
   the optical concentration measurement device measures concentration of an object to be measured existing in a light path formed by the light guiding unit, based on the detection signal output from the light receiving unit, and
   the light guiding unit guides light in such a way that area of the light on the rectangular light receiving surface is twice or more area of the rectangular light receiving surface.

5. The optical concentration measurement device according to claim 4, wherein
   the light guiding unit guides light in such a way that area of the light on the rectangular light receiving surface is four times or less area of the rectangular light receiving surface.

6. The optical concentration measurement device according to claim 4, wherein
   the light guiding unit guides light in such a way that area of the light on the rectangular light receiving surface is three times or less area of the rectangular light receiving surface.

7. The optical concentration measurement device according to claim 1, wherein
   the light guiding unit guides light only by means of reflection.

8. The optical concentration measurement device according to claim 1 further comprising
   an optical filter configured to transmit only light in a preset wavelength band on top of a light emitting surface of the LED light source or on top of a light receiving surface of the light receiving unit.

9. The optical concentration measurement device according to claim 1, wherein
   the LED light source and the light receiving unit are surface mount device type elements.

10. The optical concentration measurement device according to claim 1 further comprising
    a calculation unit configured to calculate a concentration of an object to be measured existing in a light path formed by the light guiding unit, based on the detection signal output from the light receiving unit.

11. The optical concentration measurement device according to claim 4, wherein
    the light guiding unit guides light only by means of reflection.

12. The optical concentration measurement device according to claim 4 further comprising
    an optical filter configured to transmit only light in a preset wavelength band on top of a light emitting surface of the LED light source or on top of a light receiving surface of the light receiving unit.

13. The optical concentration measurement device according to claim 4, wherein
    the LED light source and the light receiving unit are surface mount device type elements.

14. The optical concentration measurement device according to claim 4 further comprising
    a calculation unit configured to calculate a concentration of an object to be measured existing in a light path formed by the light guiding unit, based on the detection signal output from the light receiving unit.

* * * * *